(12) United States Patent
Zaffetti et al.

(10) Patent No.: US 8,991,478 B2
(45) Date of Patent: Mar. 31, 2015

(54) COMPACT TWO SIDED COLD PLATE WITH TRANSFER TUBES

(75) Inventors: Mark A. Zaffetti, Suffield, CT (US); Michael B. Laurin, South Hadley, MA (US)

(73) Assignee: Hamilton Sundstrand Space Systems International, Inc., Windsor Locks, CT (US)

( * ) Notice: Subject to any disclaimer, the term of this patent is extended or adjusted under 35 U.S.C. 154(b) by 854 days.

(21) Appl. No.: 12/748,552

(22) Filed: Mar. 29, 2010

(65) Prior Publication Data
US 2011/0232879 A1    Sep. 29, 2011

(51) Int. Cl.
| | |
|---|---|
| F28F 7/00 | (2006.01) |
| F28F 9/26 | (2006.01) |
| F28F 3/14 | (2006.01) |
| H01L 23/473 | (2006.01) |
| H05K 7/20 | (2006.01) |

(52) U.S. Cl.
CPC .......... *H01L 23/473* (2013.01); *H05K 7/20509* (2013.01); *H05K 7/20254* (2013.01); *H01L 2924/0002* (2013.01)
USPC ............................ 165/80.4; 165/144; 165/170

(58) Field of Classification Search
CPC ............. F28F 3/08; F28F 3/083; F28F 3/086; F28F 3/12; F28F 2280/06; F28F 9/0075; H05K 7/20509; H05K 7/20254
USPC ......... 428/182–186; 165/170, 90.5, 168, 171, 165/144
See application file for complete search history.

(56) References Cited

U.S. PATENT DOCUMENTS

| | | | |
|---|---|---|---|
| 3,327,776 A | 6/1967 | Butt | |
| 3,676,642 A * | 7/1972 | Rosen et al. | 392/479 |
| 4,196,775 A | 4/1980 | Groh | |
| 4,432,918 A * | 2/1984 | Paisley | 264/43 |
| 4,478,277 A * | 10/1984 | Friedman et al. | 165/185 |
| 5,088,005 A | 2/1992 | Ciaccio | |
| 5,269,372 A | 12/1993 | Chu et al. | |
| 5,484,015 A | 1/1996 | Kyees | |
| 5,495,889 A * | 3/1996 | Dubelloy | 165/104.33 |
| 5,727,619 A * | 3/1998 | Yao et al. | 165/104.33 |
| 5,740,015 A * | 4/1998 | Donegan et al. | 361/699 |
| 5,923,533 A | 7/1999 | Olson | |
| 6,034,872 A * | 3/2000 | Chrysler et al. | 361/699 |
| 6,191,945 B1 | 2/2001 | Belady et al. | |
| 6,230,790 B1 * | 5/2001 | Hemingway et al. | 165/80.4 |
| 6,349,035 B1 | 2/2002 | Koenen | |
| 6,661,133 B2 | 12/2003 | Liebermann | |

(Continued)

FOREIGN PATENT DOCUMENTS

| | | |
|---|---|---|
| CN | 102008576 | 6/2008 |
| DE | 19600166 | 7/1997 |

(Continued)

OTHER PUBLICATIONS

European Search Report for European Patent Application No. 11250351.1-1235 completed on Nov. 20, 2012.

*Primary Examiner* — Allen Flanigan
*Assistant Examiner* — Jason Thompson
(74) *Attorney, Agent, or Firm* — Carlson, Gaskey & Olds, P.C.

(57) ABSTRACT

A structural cold plate assembly includes cold plates mounted to opposing sides of a panel and in fluid communication through fluid passages that extend through the panel.

14 Claims, 3 Drawing Sheets

(56) References Cited

U.S. PATENT DOCUMENTS

| | | | |
|---|---|---|---|
| 6,745,823 B2 * | 6/2004 | Brost | 165/80.4 |
| 6,967,064 B2 * | 11/2005 | Haltiner et al. | 429/425 |
| 7,000,684 B2 | 2/2006 | Kenny et al. | |
| 7,017,654 B2 | 3/2006 | Kenny et al. | |
| 7,024,874 B2 | 4/2006 | Zywiak et al. | |
| 7,149,087 B2 | 12/2006 | Wilson et al. | |
| 7,188,488 B2 | 3/2007 | Army, Jr. et al. | |
| 7,188,662 B2 | 3/2007 | Brewer et al. | |
| 7,220,365 B2 | 5/2007 | Qu et al. | |
| 7,258,161 B2 | 8/2007 | Cosley et al. | |
| 7,353,864 B2 | 4/2008 | Zaffetti et al. | |
| 7,464,747 B2 * | 12/2008 | Nakahama et al. | 165/80.2 |
| 7,521,789 B1 | 4/2009 | Rinehart et al. | |
| 7,523,622 B2 | 4/2009 | Zywiak et al. | |
| 7,551,439 B2 * | 6/2009 | Peugh et al. | 361/699 |
| 2003/0066638 A1 | 4/2003 | Qu et al. | |
| 2006/0103011 A1 | 5/2006 | Andry et al. | |
| 2006/0266508 A1 * | 11/2006 | Johnson et al. | 165/170 |
| 2007/0023168 A1 * | 2/2007 | Flesch et al. | 165/80.4 |
| 2007/0201210 A1 | 8/2007 | Chow et al. | |
| 2008/0308260 A1 * | 12/2008 | Campbell et al. | 165/104.33 |
| 2009/0211977 A1 * | 8/2009 | Miller | 210/646 |
| 2010/0071876 A1 | 3/2010 | Lehman et al. | |
| 2011/0232879 A1 | 9/2011 | Zaffetti et al. | |

FOREIGN PATENT DOCUMENTS

| | | |
|---|---|---|
| EP | 0508717 | 2/1998 |
| EP | 1225633 | 7/2002 |
| JP | 9-250892 | 9/1997 |
| JP | 2008159746 | 7/2008 |
| JP | 2008171840 | 7/2008 |
| WO | 2008103667 | 8/2008 |

* cited by examiner

COMPACT TWO SIDED COLD PLATE WITH TRANSFER TUBES

STATEMENT REGARDING FEDERALLY SPONSORED RESEARCH OR DEVELOPMENT

This subject of this disclosure was made with government support under Contract No.: NNJ06TA25C awarded by National Aeronautics and Space Administration. The Government has certain rights in this invention.

BACKGROUND

This disclosure generally relates to a cooling structure for cooling electronic components. More particularly, this disclosure relates to a cooling structure including a two sided cold plate support assembly.

Electronic components onboard aircraft or other vehicles that operate in extreme temperatures are typically protected from overheating by a cooling device. In some environments, air flow is either not available or insufficient to handle the thermal loads generated by the electronic components. In such applications, a cold plate is utilized through which a cooling fluid flows to remove heat from the electronic component. The cold plate is mounted adjacent the electronic component and supplied with fluid flow through appropriate conduits that lead to a fluid delivery system.

SUMMARY

A disclosed structural cold plate assembly includes cold plates mounted to opposing sides of a panel and in fluid communication through fluid passages through the panel. The disclosed structural cold plate assembly includes tubes that extend from one cold plate on one side of the panel to another cold plate on an opposing side of the panel. The disclosed passages provide for fluid communication of a cooling medium between the cold plates and through the structural panel that supports heat generating devices.

These and other features disclosed herein can be best understood from the following specification and drawings, the following of which is a brief description.

DETAILED DESCRIPTION

Figure 1:
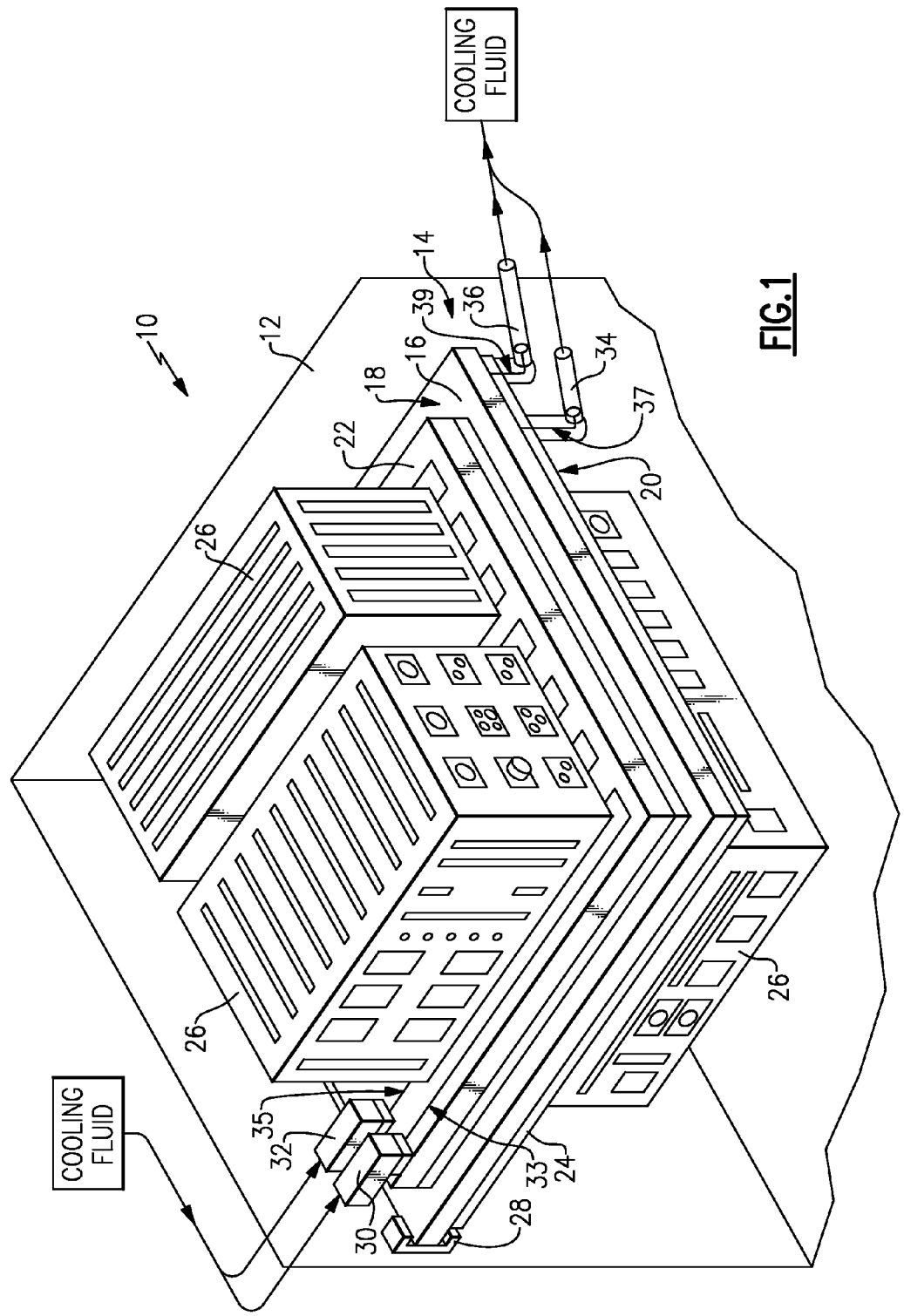
FIG. 1 is a schematic view of an example two sided structural cold plate assembly.

Referring to FIG. 1, an example support assembly 10 includes a fixed structure 12 that supports a structural cold plate assembly 14 for thermally controlling and cooling heat generating devices 26. In the disclosed example, the heat generating devices 26 are electronic devices that generate heat during operation. As appreciated, although electronic devices are described as examples, the disclosed structural cold plate assembly 14 would be useful for any application requiring thermal management.

The example structural cold plate assembly 14 includes a panel 16 that includes a first side 18 and a second side 20. Mounted to the first side 18 is a first cold plate 22 and mounted to the second side 20 is a second cold plate 24. Each of the first and second cold plates 22, 24 define passages through which a cooling medium flows to remove and control heat produced by the devices 26. The panel 16 and thereby the first and second cold plates 22, 24 are supported by at least one mount 28 to the fixed structure 12. The fixed structure 12 could be a cabinet, wall, bulkhead or other fixed structure that provides a desired location for the devices 26. Moreover, although cold plates 22, 24 are disclosed by way of example, any heat exchanging device could also be utilized and would benefit from the example disclosures.

The first and second cold plates 22, 24 include passages or circuits through which the cooling medium flows to remove heat generated by the devices 26. The devices 26 are mounted in thermal contact with each of the cold plates 22, 24 such that thermal energy is transferred to the fluid medium. In the disclosed example, the devices 26 are mounted on the corresponding cold plate 22, 24. However, other mounting configurations that place the cold plate in thermal contact with the devices 26 are within the contemplation of this disclosure.

The cooling medium is supplied by the first and second inlets 30, 32 that are mounted to the first cooling plate 22. The cooling medium can include a cooling fluid, air, or gas along with a combination of fluid, air and gas that facilitate the removal of heat generated by the devices 26. In this example the cooling plates 22, 24 each include two separate cooling circuits and therefore two inlets 30, 32 are provided. A first cooling circuit 33 and a second cooling circuit 35 within the first cooling plate 22 and a first cooling circuit 37 and second cooling circuit within the second cooling plate 24 are shown schematically in FIG. 1. The cooling medium is then directed through passages (FIGS. 2 and 3) through the panel 16 to the second cooling plate 24. The second cooling plate 24 includes first and second outlets 34 and 36 that direct the cooling medium through other portions of cooling circulation system.

As appreciated, the cooling system may include a heat exchanger to dissipate heat absorbed by the cooling medium and a pump to power circulation of the cooling medium. Moreover, the example structural cold plate assembly 14 provides for the use of different cooling mediums such as different types of fluid in each of the separate circuits to provide desired thermal control capabilities. Further, although the example structural cooling plate assembly 14 includes two separate cooling circuits, one or more than two cooling circuits are also within the contemplation for use with the disclosed device.

Figure 2:
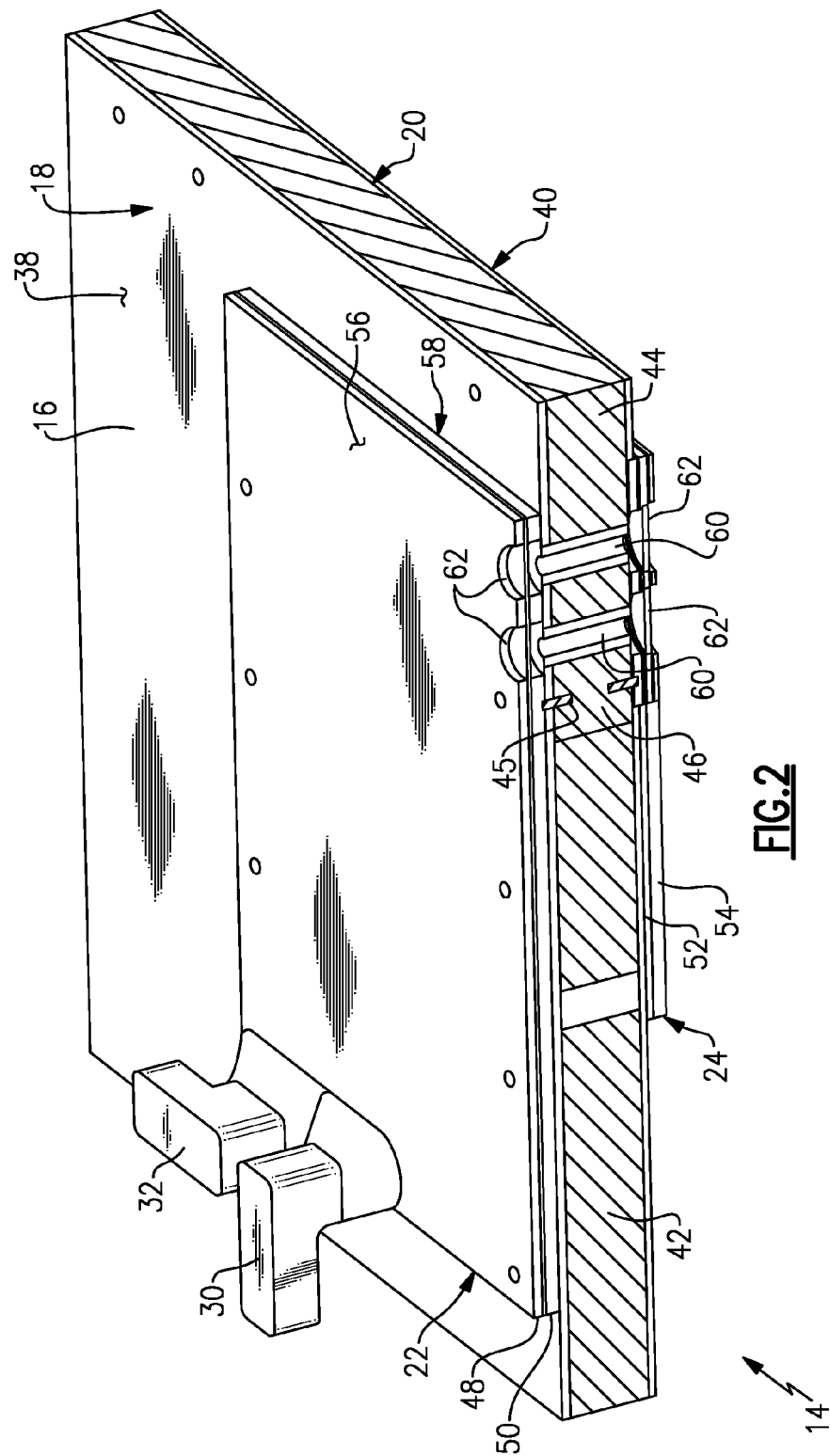
FIG. 2 is a sectional view of the example two sided structural cold plate assembly.

Referring to FIG. 2, the example panel 16 includes a top face sheet 38 and a bottom face sheet 40. The example face sheets 38, 40 are metal sheets that are adhered to top and bottom surfaces of several intermediate internal structures. Although metal sheets are disclosed by way of example, other material could be utilized to provide the structure of the face sheets 38, 40. The example panel 16 includes a honeycomb portion 42 that includes a plurality of open cells that is sandwiched between the top and bottom face sheets 38, 40. The open cell structure of the honeycomb portion 42 reduces the overall weight of the panel 16 while providing a desired structural integrity and strength. A frame structure 44 is also disposed between the two face sheets 38, 40 to provide a solid structure around the outer edges of the panel 16. The frame structure 44 also provides a location into which fasteners can be inserted.

The example face sheets 38 and 40 are adhered by an adhesive to an interior structure including the honeycomb portion 42 and the frame structure 44. The example adhesive is selected to provide the desired bond between the honeycomb portion 42, the frame structure 44 and the face sheets 38, 40 throughout the environmental operating range of the structural cold plate assembly 14.

An insert 46 is disposed within the panel 16 in the area where the tubes 60 extend. The panel 16 can also include alignment pins 45 that locate the cold plates 22, 24 relative to each other on the panel 16. Other alignment and fastening features could also be included to secure and maintain the cold plates 22, 24 in a desired orientation on the panel 16.

Figure 3:
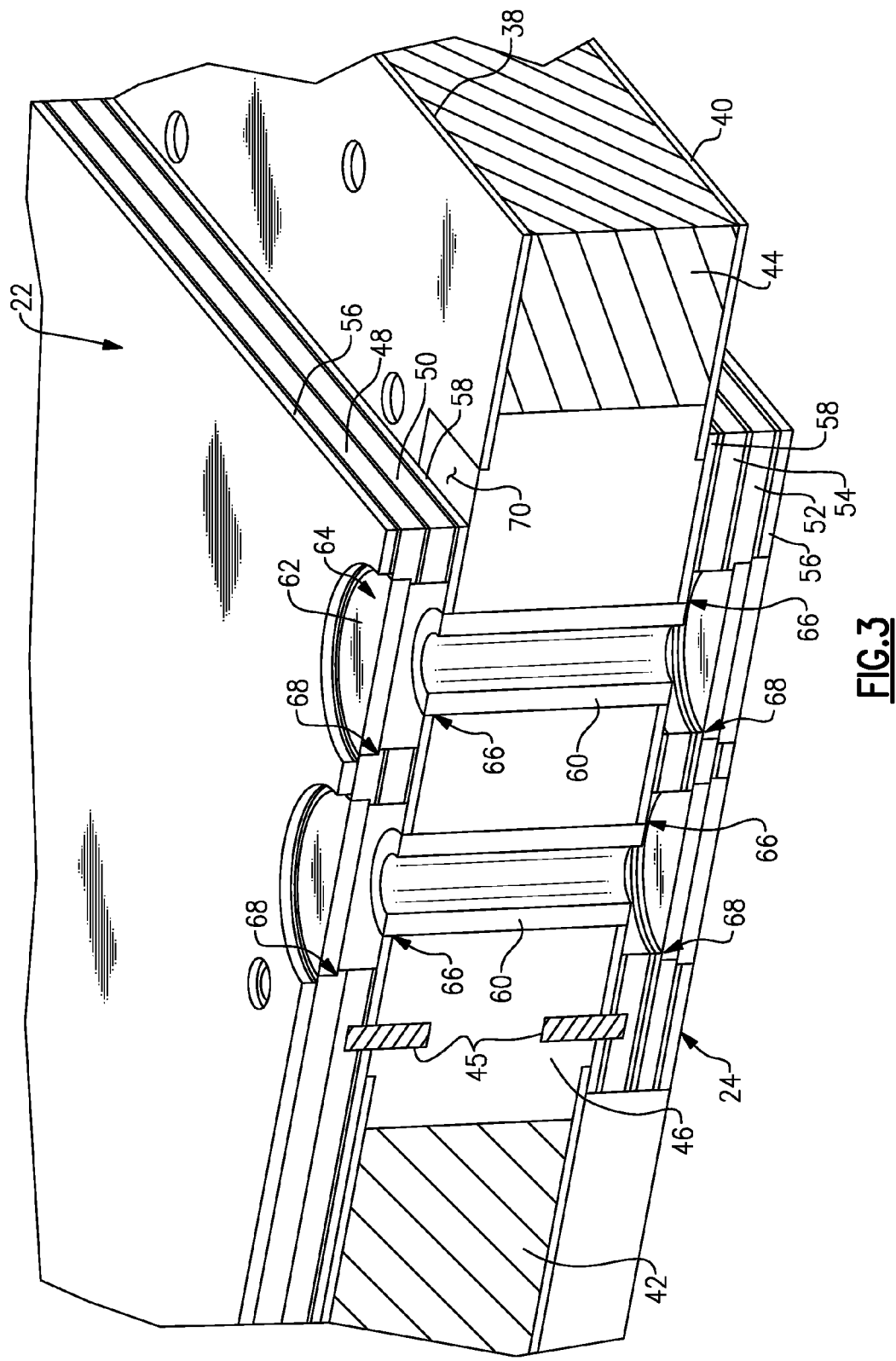
FIG. 3 is a magnified sectional view of the example two sided structural cold plate assembly.

Referring to FIG. 3 with continued reference to FIG. 2, the first and second cold plates 22, 24 each include the two separate fluid circuits 33, 35, 37 and 39. The first and second fluid circuits 33, 35 for the first cold plate 22 are defined by the circuit plates 48 and 50 (FIG. 3) and the first and second fluid circuits 37. 39 for the second cold plate 24 are defined by the circuit plates 52 and 54. The circuit plates 52, 54 are sandwiched between a top plate 56 and a bottom plate 58. The top plates 56 provide a surface on which the devices 26 are mounted. Moreover the top plates 56 are constructed of a material that provides for the transfer of thermal energy from the devices mounted thereon to the fluid medium flowing within the cooling plates 22, 24.

In this example, a first complete fluid circuit including the first circuits 33 and 37 is defined by the circuit plate 50 of the first cold plate 22 and the circuit plate 54 of the second cold plate 24. A second complete fluid circuit including the second circuits 35 and 39 is defined by the circuit plate 48 of the first cold plate 22 and the circuit plate 52 of the second cold plate 24. The specific configuration of the first and second fluid circuits are arranged to provide a desired thermal capacity for absorbing heat from the devices 26.

The fluid medium is directed from the first cold plate 22 through openings 64 in the panel 16 to the second cold plate 24. In this example, the openings 64 receive tubes 60 that are sealed to the plates 58 of the cold plates 22, 24. The tubes 60 provide the fluid communication as conduits between the cold plates and the corresponding fluid circuits.

The tubes 60 are installed through openings in the panel 16 that are created within an insert 46. Additional openings 64 are provided in the cold plates 22, 24 to provide for the insertion of tubes 60. The example tubes 60 are welded at the interface 66 with the plates 58 of the first and second cold plates 22, 24. The welded interface 66 may extend downwardly such that the insert 46 is also at least partly welded to the tubes 60. In the disclosed example, the tubes 60 are sealed using an electron beam welding process. The electron beam directs energy along the interface 66 to provide a desired fluid tight seal. The openings 64 in the cold plates 22, 24 provide access for the welding operation.

Once the tubes 60 are welded in place, the openings 64 in the cold plates 22, 24 are covered by caps 62. The example caps 62 seat onto a ledge 68 formed at the interface between the circuit plates of each cold plate 22, 24. The cap 62 is then welded in place to seal and hold it in place.

The welding operation generates heat that radiates into the panel 16 and thereby could affect the adhesive utilized to bond the face sheets to the honeycomb portion 42 and the frame structure 44. Accordingly, in this example an insert 46 is provided in the location where the tubes 60 are assembled. The example insert 46 defines the openings for the tubes 60. Further, the insert is not bonded to the face sheets 38, 40 proximate the tube weld interface 66. Instead, the insert 46 defines a portion 70 of the top side 18, and a corresponding part of the bottom side (not shown).

Because the tubes 60 extend through the panel 16, additional external inlets, outlets, connectors, conduits, tubes are not required. Therefore the tubes 60 provide a robust fluid communication passage between the first and second cold plates 22, 24 that eliminates some of the exposed fluid conduits.

The example structural cooling plate assembly 14 is fabricated by first assembling the panel 16. The example panel 16 is assembled by bonding the top face sheet 38 and the bottom face sheet 40 to the honeycomb portion 42 and frame structure 44. In the location through which the tubes 60 will extend, the insert 46 is positioned and bonded by way of an adhesive. As is shown in FIG. 3, the insert 46 provides a portion 70 that is not covered by the face sheet 38. This configuration spaces the adhesively bonded portions of the top face sheet 38 away from areas that are exposed to heat during welding operations.

The first and second cold plates 22, 24 are then assembled to include the desired circuit configurations. The example cold plates 22, 24 include two circuit plates each that separate fluid circuits that will be connected by the fluid passage through the panel. The cold plates 22, 24 are mounted to the panel 16. The openings 64 are then either created, or aligned through each of the cold plates 22, 24 and aligned with each other. In the example, the cold plates 22, 24 include the openings 64 that are aligned with the passages through the insert 46. Once the cold plates 22, 24 are aligned, the tubes 60 are inserted.

The tubes 60 are inserted such that each of the first and second ends of the tubes 60 form a substantially flush interface with the plates 58 of each corresponding cold plate 22, 24. An electron beam welding process is then performed to provide a continuous weld at the interface of the tube 60 and each of the plates 58 and the insert 46. The continuous weld provides a desired strength and provides a desired fluid tight seal. In the disclosed example, two tubes 60 are inserted and welded in place. As appreciated, other numbers of tubes could be utilized as are desired to provide the desired fluid passage between cold plates 22, 24.

In the disclosed example, the cold plates 22, 24 define two complete and separate fluid circuits. Accordingly, the fluid circuit plates 48, 50 of the first cold plate 22 and the fluid circuit plates 52, 54 of the second cold plate 24 are arranged to channel the fluid medium through a corresponding one of the tubes 60. This provides a complete fluid circuit that begins at one of the inlets 30, 32 on the top cold plate 22, through the corresponding one of the fluid circuit plates 48, 50 through one of the tubes 60, through the corresponding fluid circuit plate 52, 54 of the second cold plate 24 and out one of the outlets 34, 36 (FIG. 1). A second complete fluid circuit is defined in the same manner through those fluid circuit plates not used for the first fluid circuit.

Accordingly, the example structural cold plate assembly 14 provides a two sided thermal control structure that is built into the support structure and that reduces the number of exposed fluid conduits and connectors. Moreover, the integral structure of the disclosed structural cold plate assembly 14 aids in assembly and reduces overall package size and weight.

Although an example embodiment has been disclosed, a worker of ordinary skill in this art would recognize that certain modifications would come within the scope of this disclosure. For that reason, the following claims should be studied to determine the scope and content of this invention.

What is claimed is:
1. A cold plate assembly comprising:
a support structure including a first face sheet and a second face sheet attached to opposite sides of a honeycomb interior structure, the support structure including an insert comprising a solid block between the first face sheet and the second face sheet surrounded by the honeycomb interior structure;

a first cold plate disposed on the first face sheet of the support structure, the first cold plate including a first circuit plate disposed between a first top plate and a first bottom plate and at least one inlet;

a second cold plate disposed on the second face sheet of the support structure, the second cold plate including a second circuit plate disposed between a second top plate and a second bottom plate and at least one outlet; and a conduit extending through the insert in the support structure for communicating cooling fluid between the first cold plate and the second cold plate, wherein the conduit is sealed to the first bottom plate at a first end and to the second bottom plate at a second end of the first cold plate and the second cold plate.

2. The cold plate assembly as recited in claim 1, wherein the conduit comprises a tube extending through the insert in the support structure.

3. The cold plate assembly as recited in claim 2, wherein the seal comprises a weld between the first bottom plate and the first end of the tube and a weld between the second bottom plate and the second end of the tube.

4. The cold plate assembly as recited in claim 1, wherein the conduit is joined to the first bottom plate and the second bottom plate of each of the first and second cold plates.

5. The cold plate assembly as recited in claim 1, wherein the support structure includes a frame structure disposed between the first face sheet and the second face sheet to provide a solid structure around outer edges of the support structure.

6. The cold plate assembly as recited in claim 1, wherein each of the first and second cold plates comprises a first cooling circuit and a second cooling circuit that is separate from the first cooling circuit.

7. The cold plate assembly as recited in claim 6, wherein the conduit comprises a first conduit that communicates fluid through the support structure between the first cooling circuit in the first cold plate and the first cooling circuit in the second cold plate, and a second conduit communicates fluid through the support structure between the second cooling circuit of the first cooling plate and the second cooling circuit of the second cooling plate.

8. The cold plate assembly as recited in claim 7, including an opening through the first cold and the second cold plate aligned with each other and with a corresponding one of the first and second conduits and a cap disposed over each of the openings for sealing the openings.

9. The cold plate assembly as recited in claim 1, wherein the conduit is attached to the insert.

10. A cold plate assembly comprising:

a support structure including a first face sheet and a second face sheet attached to opposite sides of a honeycomb interior structure, the support structure including an insert comprising a solid block between the first face sheet and the second face sheet surrounded by the honeycomb interior structure;

a first cold plate disposed on the first face sheet of the support structure, the first cold plate including a first circuit plate disposed between a first top plate and a first bottom plate and at least one inlet;

a second cold plate disposed on the second face sheet of the support structure, the second cold plate including a second circuit plate disposed between a second top plate and a second bottom plate and at least one outlet; and a conduit extending through the insert in the support structure for communicating cooling fluid between the first cold plate and the second cold plate, the conduit is joined to the first bottom plate at a first end and to the second bottom plate at a second end of the first cold plate and the second cold plate, wherein each of the first cold plate and the second cold plate includes an opening aligned with the conduit and a cap disposed over each of the openings for sealing the openings.

11. The cold plate assembly as recited in claim 10, wherein a joint between the conduit and each of the first and second bottom plates comprise a weld.

12. The cold plate assembly as recited in claim 10, wherein each of the first and second cold plates comprises a first cooling circuit and a second cooling circuit that is separate from the first cooling circuit.

13. The cold plate assembly as recited in claim 12, wherein each of the first and second circuits are defined by separate circuit plates.

14. The cold plate assembly as recited in claim 12, wherein the conduit comprises a first conduit communicating fluid between the first cooling circuit in each of the first cold plate and the second cold plate and a second conduit communicating fluid between the second cooling circuit in each of the first cold plate and the second cold plate.

* * * * *